United States Patent
Morgan et al.

(10) Patent No.: US 12,408,714 B2
(45) Date of Patent: Sep. 9, 2025

(54) TEXTILES AND GARMENTS HAVING THERMOREFLECTIVE MATERIAL

(71) Applicant: NIKE, Inc., Beaverton, OR (US)

(72) Inventors: Daniel Morgan, Beaverton, OR (US); Christopher J. Ranalli, Beaverton, OR (US)

(73) Assignee: NIKE, Inc., Beaverton, OR (US)

( * ) Notice: Subject to any disclaimer, the term of this patent is extended or adjusted under 35 U.S.C. 154(b) by 293 days.

(21) Appl. No.: 17/896,676

(22) Filed: Aug. 26, 2022

(65) Prior Publication Data
US 2022/0400797 A1  Dec. 22, 2022

Related U.S. Application Data

(62) Division of application No. 16/351,249, filed on Mar. 12, 2019, now Pat. No. 11,439,191.

(Continued)

(51) Int. Cl.
| | |
|---|---|
| A41D 31/04 | (2019.01) |
| A41D 27/12 | (2006.01) |
| B32B 3/08 | (2006.01) |
| B32B 3/30 | (2006.01) |
| B32B 15/04 | (2006.01) |

(Continued)

(52) U.S. Cl.
CPC ............ *A41D 31/04* (2019.02); *A41D 27/12* (2013.01); *B32B 3/085* (2013.01); *B32B 3/30* (2013.01); *B32B 15/043* (2013.01); *B32B 37/30* (2013.01); *B32B 38/06* (2013.01); *C23C 14/028* (2013.01); *C23C 14/20* (2013.01); *C23C 14/24* (2013.01); *B32B 15/088* (2013.01); *B32B 15/09* (2013.01); *B32B 2037/246* (2013.01); *B32B 38/0012* (2013.01); *B32B 2305/18* (2013.01); *B32B 2307/30* (2013.01); *B32B 2311/00* (2013.01); *Y10T 428/24545* (2015.01)

(58) Field of Classification Search
CPC ........ C23C 14/20; C23C 14/028; C23C 14/24
See application file for complete search history.

(56) References Cited

U.S. PATENT DOCUMENTS

| | | |
|---|---|---|
| 4,023,223 A | 5/1977 | Anderson et al. |
| 4,147,829 A | 4/1979 | Holland |

(Continued)

FOREIGN PATENT DOCUMENTS

| | | |
|---|---|---|
| CN | 101858475 A | 10/2010 |
| CN | 201967719 U | 9/2011 |

(Continued)

OTHER PUBLICATIONS

Office Action received for European Patent Application No. 19717073. 1, mailed on Jan. 26, 2023, 5 pages.

(Continued)

*Primary Examiner* — Dah-Wei D. Yuan
*Assistant Examiner* — Kristen A Dagenais
(74) *Attorney, Agent, or Firm* — Shook, Hardy & Bacon L.L.P.

(57) ABSTRACT

Aspects herein are directed to a textile comprising at least one compressed portion, at least one uncompressed portion, and a deposit of thermo-reflective material on at least the compressed portion. Other aspects herein are directed to a method of manufacturing a textile or garment having a deposit of thermo-reflective material.

20 Claims, 6 Drawing Sheets

Related U.S. Application Data

(60) Provisional application No. 62/672,237, filed on May 16, 2018.

(51) Int. Cl.

| | |
|---|---|
| *B32B 37/30* | (2006.01) |
| *B32B 38/06* | (2006.01) |
| *C23C 14/02* | (2006.01) |
| *C23C 14/20* | (2006.01) |
| *C23C 14/24* | (2006.01) |
| *B32B 15/088* | (2006.01) |
| *B32B 15/09* | (2006.01) |
| *B32B 37/24* | (2006.01) |
| *B32B 38/00* | (2006.01) |

(56) References Cited

U.S. PATENT DOCUMENTS

| | | |
|---|---|---|
| 4,510,194 A | 4/1985 | Miyake et al. |
| 4,569,874 A | 2/1986 | Kuznetz |
| 5,882,770 A | 3/1999 | Makansi |
| 6,800,573 B2 | 10/2004 | Van et al. |
| 7,214,847 B1 | 5/2007 | Flick |
| 7,452,833 B2 | 11/2008 | Russell et al. |
| 7,494,946 B2 | 2/2009 | Gibson et al. |
| 8,453,210 B2 | 5/2013 | Chien et al. |
| 8,453,270 B2 | 6/2013 | Blackford |
| 8,510,871 B2 | 8/2013 | Blackford et al. |
| 8,918,919 B2 | 12/2014 | Scholz |
| 9,301,557 B1 | 4/2016 | Santos |
| 9,596,896 B2 | 3/2017 | Coza et al. |
| 9,668,530 B2 | 6/2017 | Miller et al. |
| 2003/0198783 A1 | 10/2003 | Makansi |
| 2006/0046029 A1* | 3/2006 | Cho ................ B32B 3/263 428/156 |
| 2009/0008260 A1 | 1/2009 | Chang |
| 2010/0011491 A1 | 1/2010 | Goldmann et al. |
| 2011/0203783 A1 | 8/2011 | Blackford et al. |
| 2011/0275262 A1 | 11/2011 | Suzuki et al. |
| 2012/0178321 A1 | 7/2012 | Brunswick |
| 2012/0288662 A1 | 11/2012 | Conolly |
| 2013/0052419 A1* | 2/2013 | Yializis ............ B05D 5/067 428/196 |
| 2013/0061448 A1 | 3/2013 | Orologio |
| 2013/0291270 A1 | 11/2013 | Fialko |
| 2014/0079920 A1 | 3/2014 | Blakely |
| 2014/0356574 A1* | 12/2014 | Conolly ............ B32B 5/026 204/192.15 |
| 2015/0072113 A1 | 3/2015 | Terrell |
| 2015/0223533 A1 | 8/2015 | Blakely et al. |
| 2015/0366281 A1 | 12/2015 | Miller et al. |
| 2016/0318231 A1 | 11/2016 | Schwab |
| 2016/0366963 A1 | 12/2016 | Koshkaroff et al. |
| 2017/0182733 A1 | 6/2017 | Orologio |
| 2018/0066922 A1 | 3/2018 | Howland |
| 2018/0229468 A1 | 8/2018 | Olmsted et al. |
| 2018/0343944 A1 | 12/2018 | Morgan |
| 2019/0110541 A1 | 4/2019 | Blackford et al. |
| 2019/0322028 A1 | 10/2019 | Schwab |
| 2019/0350284 A1 | 11/2019 | Morgan et al. |

FOREIGN PATENT DOCUMENTS

| | | |
|---|---|---|
| EP | 0560384 A1 | 9/1933 |
| GB | 1255016 A | 11/1971 |
| GB | 2344738 B | 11/2000 |
| GB | 2411621 A | 9/2005 |
| JP | 2013-10337 A | 1/2013 |
| KR | 10-2009-0026629 A | 3/2009 |
| KR | 10-1203900 B1 | 11/2012 |
| WO | 2010/129923 A2 | 11/2010 |
| WO | 2012/073096 A1 | 6/2012 |
| WO | 2014/120867 A1 | 8/2014 |

OTHER PUBLICATIONS

Chao et al., "Cold protective clothing with reflective nano-fibrous interlayers for improved comfort", International Journal of Clothing Science and Technology 25.5, 11 pages.

D et al., "Total Body Zoned Cooling and Heating Suit for Divers", Available online at: <http://dspace.rubicon-foundation.org:8080/xmlui/handle/123456789/1492>, 2 pages.

John, Breckenridger., "Insulating effectiveness of metallized reflective layers in cold weather clothing systems", No. USARIEM-T-2178. Army Research Inst of Environmental Medicine Natick MA, 1978, 44 pages.

* cited by examiner

TEXTILES AND GARMENTS HAVING THERMOREFLECTIVE MATERIAL

CROSS-REFERENCE TO RELATED APPLICATIONS

This application is a divisional of U.S. Non-Provisional application Ser. No. 16/351,249 (filed Mar. 12, 2019), which claims priority to U.S. Provisional Patent Application No. 62/672,237 (filed May 16, 2018). Each of the aforementioned applications is incorporated herein by reference in its entirety.

TECHNICAL FIELD

Aspects herein relate to textiles and garments made therefrom having a deposit of thermo-reflective material and compressed in select areas of the textile.

BACKGROUND

Traditional textiles having thermo-reflective features are generally configured so that the thermo-reflective feature comprises a film that is superimposed on the textile. The film may negatively affect breathability and permeability of the underlying textile.

Moreover, many conventional performance or functional textiles and garments are designed either to cool a wearer or keep the wearer warm. Cooling textiles and garments characteristically possess breathability, permeability, and/or wicking qualities. As a result, body heat and/or perspiration is transferred away from the user and through the textile. Warming textiles characteristically possess insulative properties to trap and retain body heat between the wearer and the textile. Some of these warming textiles may sacrifice breathability, permeability, and/or wicking characteristics to increase heat retention.

DESCRIPTION OF THE DRAWINGS

Examples of aspects herein are described in detail below with reference to the attached drawing figures, wherein.

DETAILED DESCRIPTION

Figure 1:
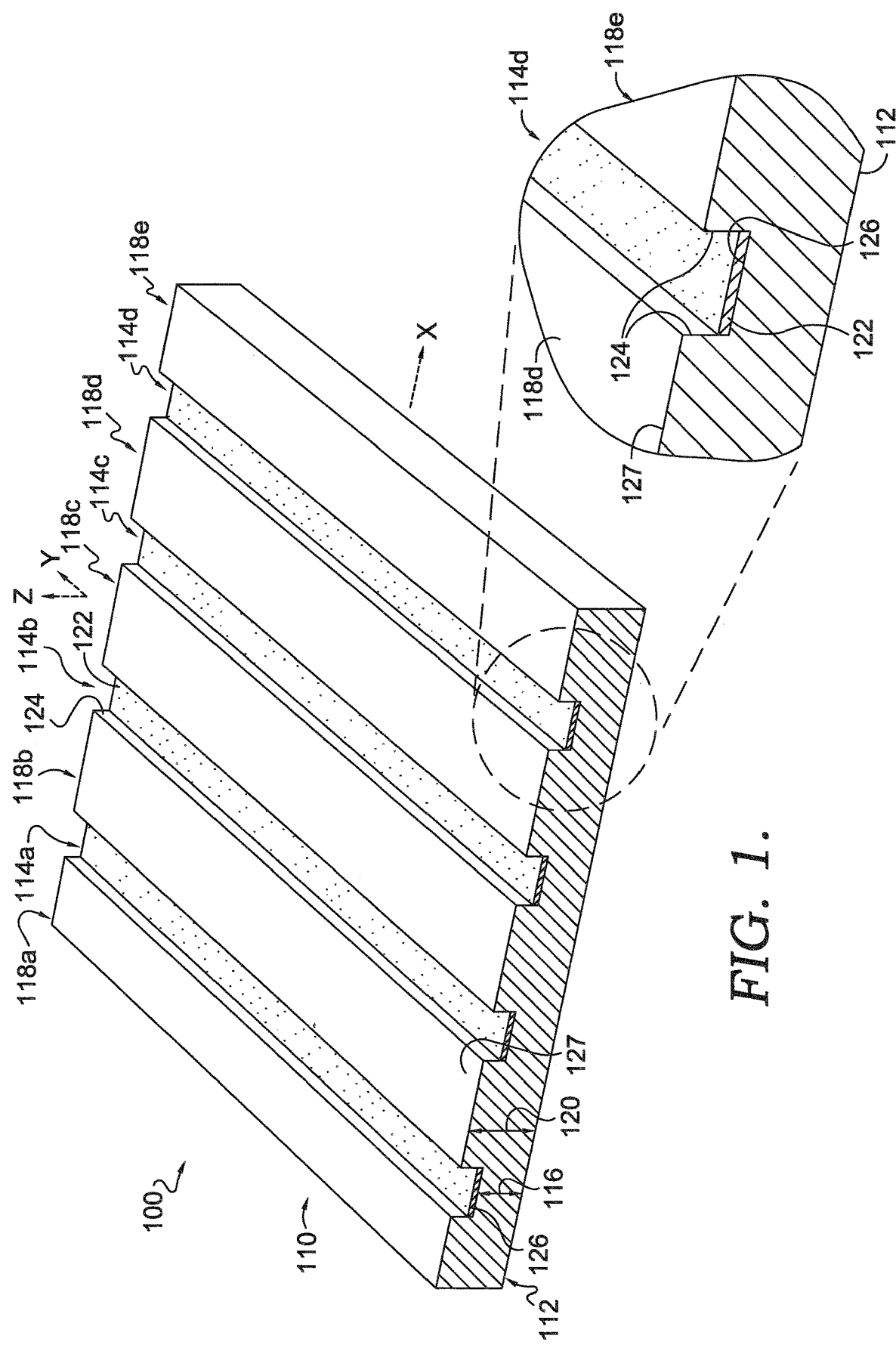
FIG. 1 illustrates a perspective view of an example textile having a thermo-reflective material deposited in select compressed portions of the textile in accordance with aspects herein.

The subject matter of the present invention is described with specificity herein to meet statutory requirements. However, the description itself is not intended to limit the scope of this disclosure. Rather, the inventors have contemplated that the claimed or disclosed subject matter might also be embodied in other ways, to include different steps or combinations of steps similar to the ones described in this document, in conjunction with other present or future technologies. Moreover, although the terms "step" and/or "block" might be used herein to connote different elements of methods employed, the terms should not be interpreted as implying any particular order among or between various steps herein disclosed unless and except when the order of individual steps is explicitly stated.

By way of background, the human body does not radiate heat uniformly. Certain zones of the human body may emit higher amounts of heat energy or thermal radiation, for example, the axillary region. Certain zones of the human body may emit lower amounts of heat energy, for example, the forearms. In order to optimize a garment's ability to regulate the unequal thermal dispersion of body heat generated by a user, aspects herein contemplate a garment utilizing a zonal variance of higher infrared (IR) reflectivity portions. That is, in areas of relatively high heat radiance or high thermal radiation, the garment in accordance with aspects herein may have a higher proportion of compressed and thermo-reflective coated portions to uncompressed and/or uncoated portions.

At a high level, aspects herein relate to a textile, and garments formed from the textile, having a deposit of thermo-reflective material and compressed in select areas of the textile. In example aspects, the textile comprises a first surface and a second surface opposite the first surface. The first surface comprises a compressed portion and an uncompressed portion, where the compressed portion comprises a deposit of thermo-reflective material. In example aspects, the textile is compressed such that the planar continuity of the first surface is interrupted by the compressed portions, whereas the second surface is substantially planar. The surface of the compressed portion of the textile provides a flatter substrate for the deposit of the thermo-reflective material as compared to the uncompressed portion. In one example aspect, the uncompressed portion does not comprise a deposit of a thermo-reflective material. As such, with respect to this aspect, the compressed portion comprising the thermo-reflective material helps to reflect back towards a wearer's body surface, at least a portion of the IR heat waves emitted by the wearer's body.

Continuing, in other aspects, the uncompressed portion also comprises a deposit of thermo-reflective material. In aspects where the uncompressed portion comprises a deposit of thermo-reflective material, the increased flatness of the compressed portion may result in a measurable increase in luster, yielding increased reflectivity of IR heat waves by the thermo-reflective material deposited in the compressed portion as compared to the uncompressed portion. More particularly, because the compressed portion is flatter, the thermo-reflective material is applied in a more planar, regular manner than the uncompressed portion. This is because the uncompressed portion may comprise a more uneven surface due to, for instance, the texture of the yarns used to form the textile and the interlacing of the yarns when knit or woven. Thus, the thermo-reflective material is deposited in a more random manner compared to the compressed portion. That being said, it is contemplated herein that the compressed portion is also effective to reflect IR heat waves. In all aspects, the textile in accordance with aspects herein has thermoregulation characteristics by reflecting at least a portion of the IR heat waves emitted by a wearer's body without sacrificing breathability, permeability, and/or wicking qualities compared to some traditional warming textiles. This is because a vapor deposition process is used to deposit the thermo-reflective material onto the textile. The thermo-reflective material provides IR reflectivity but the textile remains porous enough to be both breathable and permeable. In contrast, a solid thermo-reflective material, such as a laminate film, may be relatively impermeable and lacks breathability.

When the textile is incorporated into a garment, the thermo-reflective material is positioned so as to be on an inner-facing surface of the garment. Moreover, portions of the garment having greater reflectivity (i.e., more thermo-reflective material and/or more compressed portions with thermo-reflective material) may be configured to correspond to (i.e., be positioned adjacent to) high heat loss portions of a wearer's body, and portions of the garment having less reflectively (i.e., less thermo-reflective material and/or less compressed portions) may be configured to correspond to (i.e., be positioned adjacent to) low heat loss portions of the wearer's body. By utilizing a garment as described, higher zonal reflectivity of emitted body heat slows total thermal dissipation in high heat loss portions of the wearer's body while lower zonal reflectively of emitted body heat helps to maintain wearer comfort in low heat loss areas. Despite increased thermal retention, the garment retains permeability, breathability, and wicking characteristics due to the thermo-reflective material being deposited via a vapor deposition process.

Accordingly, aspects herein are directed to a textile comprising a first surface and a second surface opposite the first surface. The first surface comprises at least one compressed portion and at least one uncompressed portion. The at least one compressed portion has a first thickness as measured from a surface of the compressed portion to the second surface. The at least one uncompressed portion has a second thickness as measured from a surface of the uncompressed portion to the second surface, where the first thickness is less than the second thickness. The at least one compressed portion additionally comprises a first deposit of a thermo-reflective material.

Aspects herein are further directed to a garment comprising a first textile layer having a first surface and a second surface opposite the first surface. The first surface comprises at least one compressed portion at a first predetermined location on the first textile layer. The first surface additionally comprises at least one uncompressed portion at a second predetermined location. The compressed portion comprises a first deposit of thermo-reflective material and the uncompressed portion comprises a second deposit of thermo-reflective material.

Aspects herein are additionally directed to a method of manufacturing a reflective textile by first selectively compressing at least a portion of a first surface of the textile to form at least one compressed portion and at least one uncompressed portion. Next, a thermo-reflective material is applied to at least the first surface of the compressed portion of the textile via a vapor deposition process.

Positional terms as used herein to describe a garment such as "anterior," "posterior," "front," "back," "upper," "lower," "inner-facing surface," "outer-facing surface," and the like are with respect to the garment being appropriately sized and being worn as intended by a wearer standing in an upright position. The term "knit," as used herein is meant to encompass both warp knit and weft knit fabrics as is known in the art of textiles.

The term "continuous" as used in reference to deposits of thermo-reflective material means a deposit of thermo-reflective material without interruption. This is meant to exclude intentionally stopping a first deposit of thermo-reflective material and starting a second deposit of thermo-reflective material at some point subsequent; such a discontinuous deposit resulting in a trailing edge of the first deposit and a leading edge of a second deposit. The term "continuous" as used herein is meant to encompass a deposit having unintentional, intermittent, isolated interruptions or gaps (e.g., from a manufacturing defect, due to fabric irregularities, due to naturally occurring spaces or gaps between yarns in a knit or woven textile, caused by wear or manipulation of the textile, and the like) from a discontinuous deposit as described above.

Continuing, the term "thermo-reflective material" means any one or more materials having high reflectively and/or low emissivity characteristics in portions of the electromagnetic spectrum comprising body heat emissions, for example, infrared waves. Non-limiting examples of such a material may include, liquid, aqueous, vaporized, or powdered metals such as aluminum (Al), zinc (Zn), nickel (Ni), copper (Cu), silver (Ag), tin (Sn), cobalt (Co), manganese (Mn), iron (Fe), magnesium (Mg), lead (Pb), chromium (Cr), and/or alloys thereof. Further, example reflective materials may comprise non-metallic substances or compounds comprising metals such as metalized biaxially-oriented polyethylene terephthalate (BoPET), commonly known by the trade name Mylar®, Melinex®, and Hostaphan®, and metalized polyethylene terephthalate (PET). Other example reflective materials may comprise semi-metallic substances such as silicon (Si) and silicon containing compounds. As used herein, emboss refers to a surface (or method of forming a surface) that stands out in relief from adjacent surfaces. Deboss refers to a surface (or method of forming a surface) that is indented or recessed from adjacent surfaces.

Turning now to FIG. 1, a perspective view of an example textile 100 is illustrated in accordance with aspects herein. In aspects, the textiles disclosed in accordance with aspects herein are of a woven construction. In other aspects, the various disclosed textiles may be a knit construction (e.g., a single knit or double knit), or any other construction capable of being selectively compressed and at least partially coated with a thermo-reflective material (e.g., a non-woven construction). In some aspects, a textile in accordance with aspects herein may have both woven portions, knit portions, and/or non-woven portions. In some example aspects, a knit textile in accordance with aspects herein may be calendared to create a substantially smooth and uniform surface for receipt of the thermo-reflective material. A textile in accordance with aspects herein may comprise nylon yarns or polyester yarns. In example aspects, the nylon or polyester yarns may comprise less textured and/or flat yarns. Any and all aspects, and any variation thereof, are contemplated as being within aspects herein.

The textile 100 comprises a first surface 110 and a second surface 112 opposite the first surface 110. In aspects, the second surface 112 is substantially planar with respect to an x, y plane. The planar continuity of the first surface 110 may be interrupted by one or more compressed portions 114a, 114b, 114c, 114d. Therefore, in example aspects, the textile 100 may comprise one or more compressed portions 114a, 114b, 114c, or 114d, and one or more uncompressed portions 118a, 118b, 118c, 118d, and 118e. In aspects, an uncompressed portion, such as the uncompressed portion 118b, may separate two compressed portions, such as 114a and 114b. To state it a different way, a compressed portion, such as compressed portion 114a, may separate two uncompressed portions, such as uncompressed portions 118a and 118b.

Continuing, using compressed portion 114a as an example compressed portion, the compressed portion 114a, of the textile 100 has a first thickness 116 as measured between a surface 126 of the compressed portion 114a and the second surface 112. In aspects, the first thickness 116 may be in the range of from about 0.25 mm to about 15 mm. As used herein, the term "about" means within ±5% of a designated value. Using uncompressed portion 118b of the textile 100 as an example uncompressed portion, the uncompressed portion 118b has a second thickness 120 as measured between a surface 127 of the uncompressed portion 118b and the second surface 112. In aspects, the second thickness 120 may be in the range of from about 0.30 mm to about 20 mm. Continuing, the difference in thickness between the second thickness 120 and the first thickness 116 may be from about 0.1 mm to about 1.0 cm, from about 0.1 mm to about 8 mm, or from about 0.1 mm to about 4 mm.

In the aspect shown in FIG. 1, the compressed portions 114a, 114b, 114c, and 114d comprise one or more deposits of a thermo-reflective material 122. A blown up view of the compressed portion 114d is shown in FIG. 1 to better illustrate the deposit of thermo-reflective material 122. The structure of the compressed portion 114d shown in the blown-up portion of FIG. 1 is generally similar to the compressed portions 114a, 114b, and 114c of FIG. 1. In example aspects, the compressed portion 114d may comprise two sidewalls 124, the surface 126, and the deposit of thermo-reflective material 122. As will be explained more fully below, due to the process used to form the textile 100, the compressed portion 114d comprises the same textile as the uncompressed portions 118a-118e, but at a higher density or compactness. As seen, the surface 126 of the compressed portion 114d is substantially parallel to but offset from the surface 127 of the uncompressed portions 118d and 118e. It is further parallel to but offset from the second surface 112. To describe it in a different way, the surface 126 of the compressed portion 114d is positioned between the surface 127 of the uncompressed portions 118d and 118e and the second surface 112. The two sidewalls 124 may be substantially perpendicular to the surface 126 of the compressed portion 114d. Though each of the two sidewalls 124 are illustrated as substantially perpendicular to the surface 126 of the compressed portion 114d, in aspects, the sidewalls 124 may be positively or negatively sloped with respect to the surface 126 and may be linear or curved. Any and all aspects, and any variation thereof, are contemplated as being within aspects herein.

With continued respect to the blown up view of FIG. 1, the compressed portion 114d comprises the deposit of thermo-reflective material 122. The thermo-reflective material 122 may have a thickness of less than 0.025 mm. In other aspects, the thermo-reflective material 122 may have a thickness of less than 1 mm. In yet other aspects, the thermo-reflective material 122 may have a thickness of less than 1 micron. In aspects the thermo-reflective material 122 may be limited to the surface 126 of the compressed portion 114d. In other aspects, at least a portion of the thermo-reflective material 122 may extend partially through the surface 126 of the compressed portion 114d. For example, the thermo-reflective material 122 may extend between at least some of the fibers/filaments/yarns used to form the textile 100. In some aspects, the thermo-reflective material 122 in a particular compressed portion may be of uniform thickness or may be of varying thickness. Any and all aspects, and any variation thereof, are contemplated as being within aspects herein.

Figure 2:
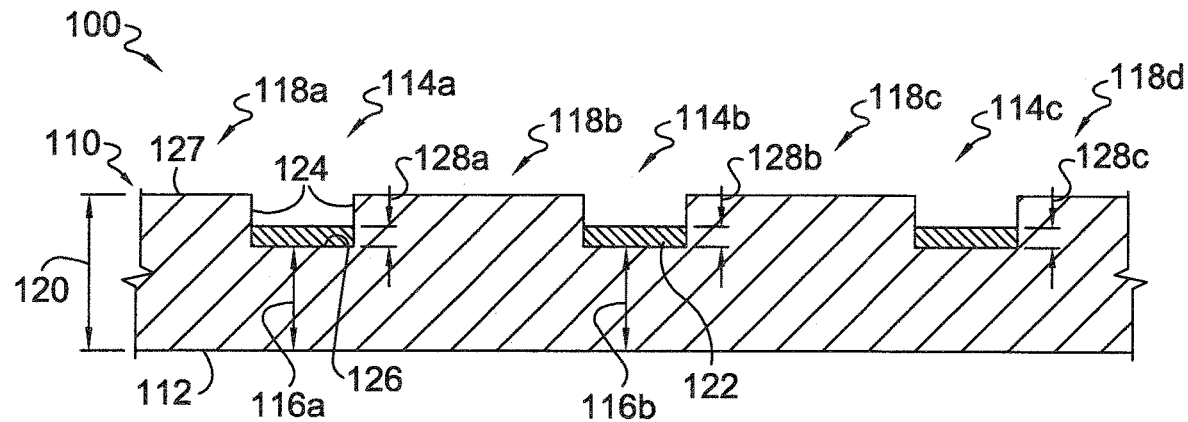
FIG. 2 illustrates a cross-sectional view of the example textile of FIG. 1 in accordance with aspects herein.

Turning now to FIG. 2, a side view or cross-sectional view of a portion of the textile 100 is illustrated in accordance with aspects herein. As shown, the textile 100 comprises the compressed portions 114a, 114b and 114c, and the uncompressed portions 118a, 118b, 118c, and 118d. As shown, the uncompressed portion 118b separates the compressed portions 114a and 114b, and the uncompressed portion 118c separates the compressed portions 114b and 114c.

Although the widths of the various compressed portions 114a, 114b, 114c are illustrated as being generally equal to one another, it is contemplated herein that they may each comprise a different width, or that one or more may comprise a different width. Similarly, although the widths of the various uncompressed portions 118a, 118b, 118c, and 118b are shown as being generally equal to one another, it is contemplated herein that they may each comprise a different width, or that one or more may comprise a different width. In aspects, varying the width of any one or more of the compressed and/or uncompressed portions may increase or decrease the amount of heat waves reflected inwardly to a wearer when implemented in a garment in an as-worn configuration. For example, more heat is radiated outward from the axilla of a wearer than the abdomen. Because a greater amount of IR heat waves are reflected by the thermo-reflective material deposited in the compressed portions, increasing the width of compressed portions and/or decreasing the width of intervening uncompressed portions in the axilla region, may reflect greater amounts of heat back towards the wearer. Varying the width of either the compressed portions, the uncompressed portions, or both is desirable in order to make a textile better suited for particular applications or for usage in particular portions of a wearer's body (as will be discussed in greater detail herein).

Using the compressed portions 114a and 114b as examples, the compressed portion 114a may have a thickness 116a and the compressed portion 114b may have a thickness 116b. In aspects, the thickness 116a of the compressed portion 114a and the thickness 116b of the compressed portion 114b may be the same or different. In aspects, varying the thickness of the compressed portions of the textile 100 may make it better suited for particular applications.

With continued respect to FIG. 2, in aspects, the thickness of thermo-reflective material 122 in a particular compressed portion may vary. As disclosed above, the thickness of the thermo-reflective material 122 may be constant or may vary within any particular compressed portion 114a, 114b, or 114c. The thickness of the thermo-reflective material 122 may also be constant or vary across multiple compressed portions 114a, 114b, and 114c. For example, a thickness 128a of the thermo-reflective material 122 in the compressed portion 114a may be generally equal or different than a thickness 128*b* of the thermo-reflective material 122 in the compressed portion 114*b*, and either or both may be different than a thickness 128*c* of the thermo-reflective material 122 in the compressed portion 114*c*. In aspects, the composition of the thermo-reflective material 122 in the compressed portion 114*a* may be the same or different than the composition of the thermo-reflective material 122 in the compressed portion 114*b*. For example the compressed portion 114*a* may comprise a first thermo-reflective material (e.g., aluminum) and the compressed portion 114*b* may comprise a different, second thermo-reflective material (e.g., stainless steel). Any and all aspects, and any variation thereof, are contemplated as being within aspects herein.

Figure 3:
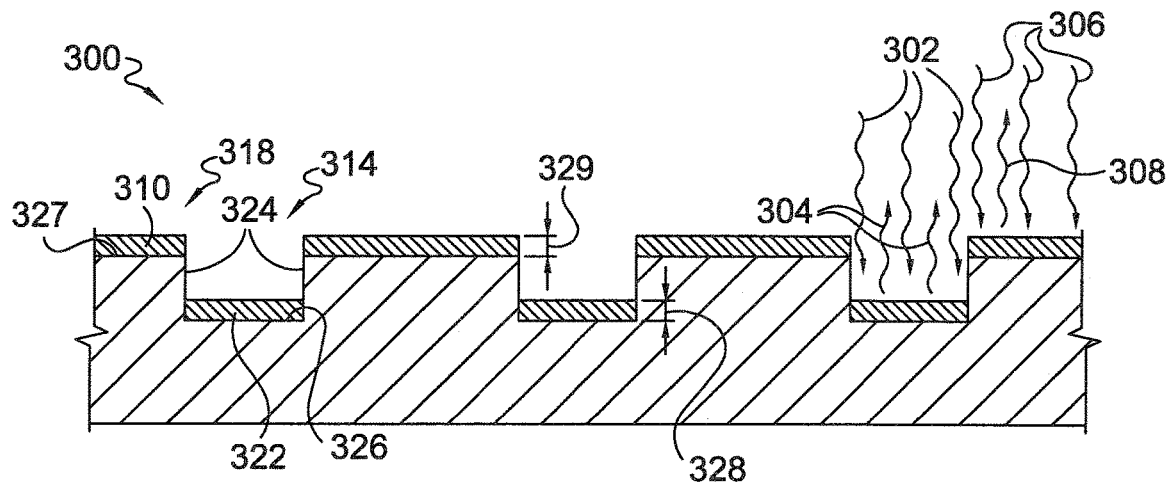
FIG. 3 illustrates a cross-sectional view depicting a textile having thermo-reflective material deposited in compressed portions and uncompressed portions of the textile in accordance with aspects herein.

Turning now to FIG. 3, a side view or cross-sectional view of a textile 300 is illustrated in accordance with aspects herein. The textile 300 may incorporate any feature disclosed in reference to the textile 100 discussed above, and may differ only in additionally comprising a second deposit of thermo-reflective material 310. In accordance with such an aspect, the textile 300 comprises a first deposit of thermo-reflective material 322 on a surface 326 of a compressed portion 314 and a second deposit of thermo-reflective material 310 on a surface 327 of an uncompressed portion 318. In such aspects, sidewalls 324 of the compressed portion 314 do not comprise a deposit of thermo-reflective material other than that amount of the thermo-reflective material 322 deposited on the surface 326 of the compressed portion 314.

In aspects, the thickness and composition of the first and second deposits of thermo-reflective material 322 and 310 may be the same or may vary. The first deposit of thermo-reflective material 322 may have a thickness 328 and the second deposit of thermo-reflective material 310 may have a thickness 329. In some aspects, the thickness 328 of the first deposit of thermo-reflective material 322 may be the same or different than the thickness 329 of the second deposit of thermo-reflective material 310 Likewise, the composition of the first deposit of thermo-reflective material 322 may be the same or different than the composition of the second deposit of thermo-reflective material 310 (e.g., one may be aluminum and one may be stainless steel).

In aspects, the first deposit of thermo-reflective material 322 may have greater reflectivity properties than the second deposit of thermo-reflective material 310. For example, as shown in FIG. 3, a first set of infrared waves 302 are directed to the compressed portion 314. A portion 304 of the first set of infrared waves 302 are reflected by the first deposit of thermo-reflective material 322. A second set of infrared waves 306 are directed to the uncompressed portion 318. A portion 308 of the second set of infrared waves 306 are reflected by the second deposit of thermo-reflective material 310. In aspects, the first deposit of thermo-reflective material 322 reflects a greater percentage of the first set of infrared waves 302 than the second deposit of thermo-reflective material 310 reflects of the second set of infrared waves 306. This is because the textile substrate of the surface 326 of the compressed portion 314 is flatter, more compacted, and more uniform than the surface 327 of the uncompressed portion 318 due to being compressed, resulting in the vapor-deposited thermo-reflective material having a more uniform, more planar, and therefore more reflective, surface.

In aspects, reflectivity properties of the first deposit of thermo-reflective material 322 and the second deposit of thermo-reflective material 310 may be measured by an emiss-o-meter, reflectometer, spectrometer, or any other device used to measure total, hemispherical, and/or directional reflectance. Reflectivity (interchangeably referred to as reflectance herein) may be measured as a percentage or ratio of spectral or radiant flux reflected by a surface divided by that received by the surface. In aspects, the total reflectance of the first deposit of thermo-reflective material may be in the range of from about 70% to about 90%. For example, the reflectance of the first deposit of thermo-reflective material may be about 80%. The total reflectance of the second deposit of thermo-reflective material may be in the range of from about 25% to about 50%. For example the reflectance of the second deposit of thermo-reflective material may be between from about 30% to about 40%. In aspects, the total reflectance of the first deposit of thermo-reflective material 322 may be greater than the total reflectance of the second deposit of thermo-reflective material 310.

Figure 4:
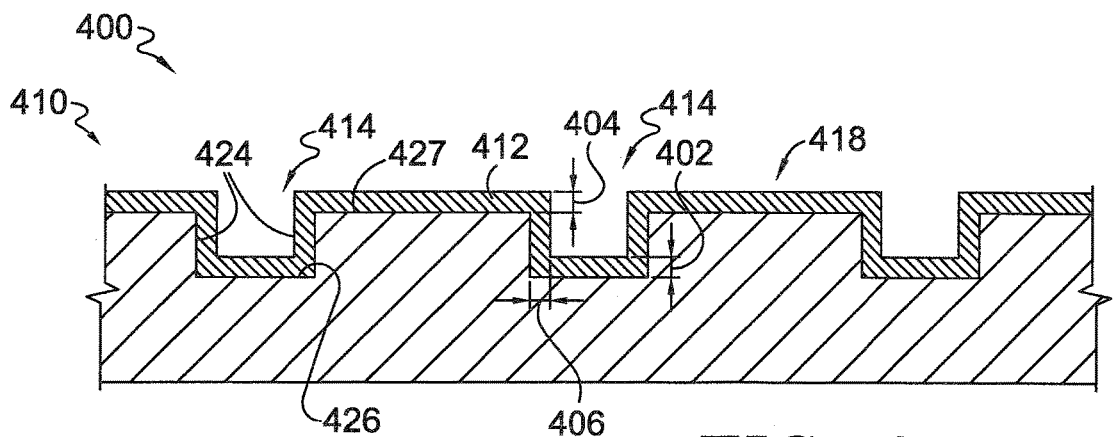
FIG. 4 illustrates a cross-sectional view depicting a textile having thermo-reflective material continuously deposited on compressed and uncompressed portions of the textile in accordance with aspects herein.

Referring now to FIG. 4, a side view or cross-sectional view of a textile 400 is illustrated in accordance with aspects herein. The textile 400 comprises a continuous deposit of thermo-reflective material 412 on a surface 427 of uncompressed portions 418, sidewalls 424, and a surface 426 of compressed portions 414. To describe it differently, the thermo-reflective material 412 may be without purposeful interruptions on the uncompressed portions 418, the sidewalls 424, and the compressed portions 414. The continuous deposit of thermo-reflective material 412 may have a thickness 404 on the uncompressed portions 418, a thickness 402 on the compressed portions 414, and a thickness 406 on the sidewalls 424. The different thicknesses 402, 404, and 406 may be generally equal or different.

As well, the composition of the continuous deposit of thermo-reflective material 412 may be uniform or may vary in certain portions of the textile 400. By way of example, the portion of the continuous deposit of thermo-reflective material 412 on the uncompressed portions 418 may comprise a first substance (e.g., aluminum) and, on the compressed portions 414, may comprise a second substance (e.g., stainless steel). The portion of the continuous deposit of thermo-reflective material 412 on the sidewalls 424 may comprise the same or different thermo-reflective material as on the compressed portions 414 and the uncompressed portions 418.

Figure 5:
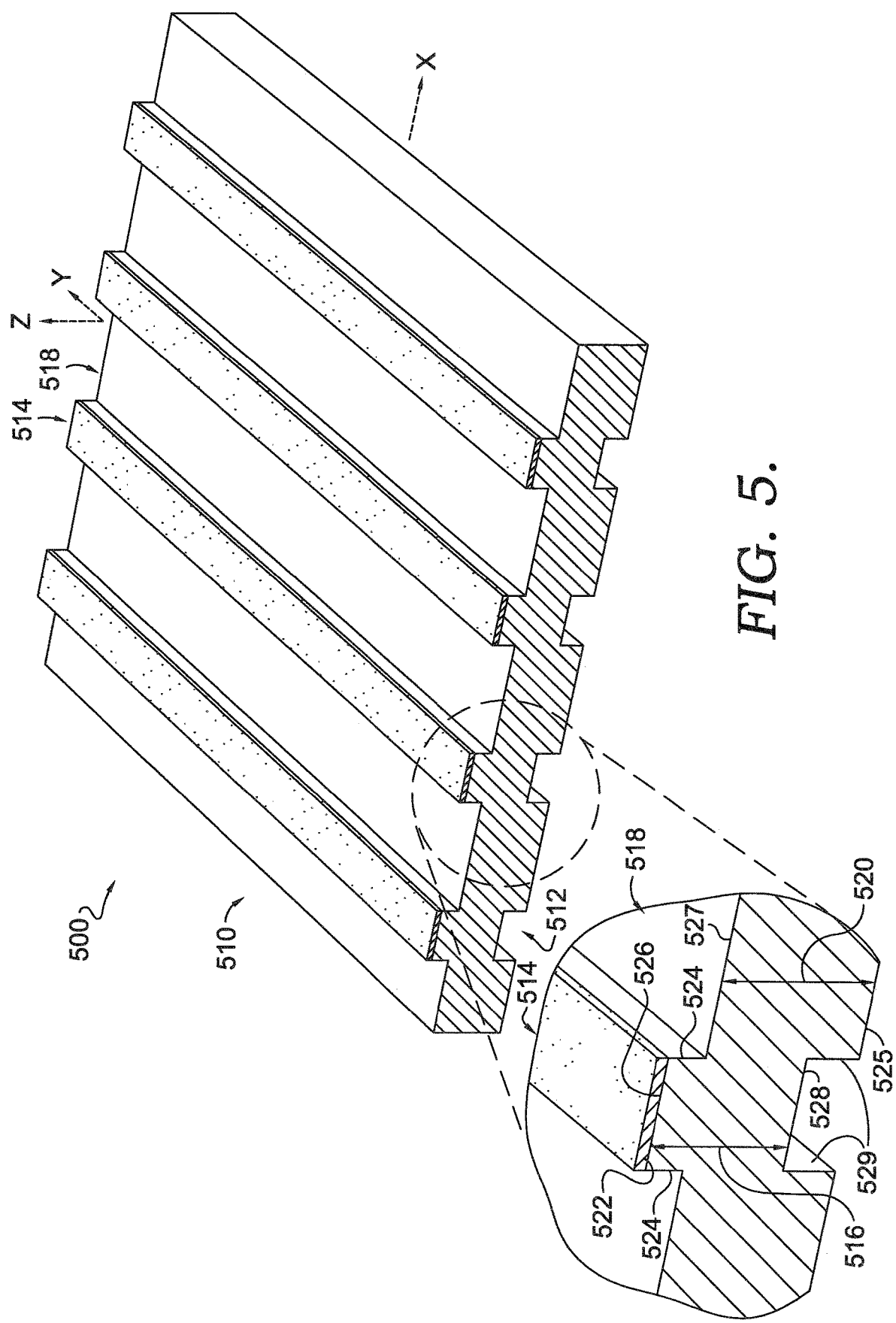
FIG. 5 illustrates a perspective view of an embossed textile having thermo-reflective material deposited on embossed portions in accordance with aspects herein.

Turning now to FIG. 5, an embossed textile 500 is illustrated in accordance with aspects herein. The embossed textile 500 comprises a first surface 510, a second surface 512 opposite the first surface 510, one or more compressed portions as illustrated by reference numeral 514, and one or more uncompressed portions as illustrated by reference numeral 518. With respect to the blow-up portion of FIG. 5, the compressed portion 514 comprises a first surface 526, a second surface 528 opposite the first surface 526, a first set of sidewalls 529 and a second set of sidewalls 524. The compressed portion 514 may have a thickness 516 as measured between the first surface 526 and the second surface 528. In the uncompressed portion 518, the embossed textile 500 may have a second thickness 520 as measured between a first surface 527 of the uncompressed portion 518 and a second surface 525 of the uncompressed portion 518 where the second surface 525 is opposite the first surface 527. In aspects, the thickness 516 is less than the second thickness 520.

With continued reference to the blown up view, the first surface 526 of the compressed portions 514 is planar to (with respect to an x, y plane) but offset in a positive z direction from first surface 527 of the uncompressed portion 518. Similarly, the second surface 528 of the compressed portions 514 is planar to (with respect to an x, y plane) but offset in a positive z direction from the second surface 525 of the uncompressed portion 518.

In example aspects, the embossed textile 500 may comprise a first deposit of thermo-reflective material 522 only on the first surface 526 of the compressed portions 514. Alternatively, in aspects not shown, the embossed textile 500 may further comprise a second deposit of thermo-reflective material on the first surface 527 of the uncompressed portions 518, without any deposit of thermo-reflective material on the second set of sidewalls 524. In an additional aspect not shown, the embossed textile 500 may comprise a single, continuous deposit of thermo-reflective material on the first surface 526 of the compressed portions 514, the first surface 527 of the uncompressed portions 518, and the second set of sidewalls 524. Any and all aspects, and any variation thereof, are contemplated as being within aspects herein.

Figure 6:
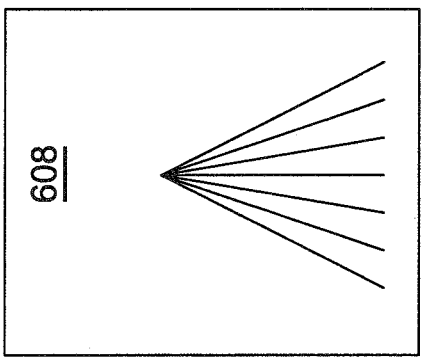
FIG. 6 illustrates example patterns of thermo-reflective material deposited on compressed portions of a textile in accordance with aspects herein.
Figure 6:
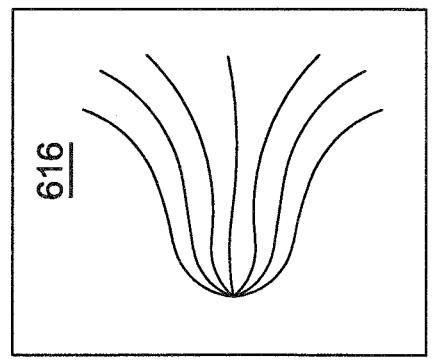
Figure 6:
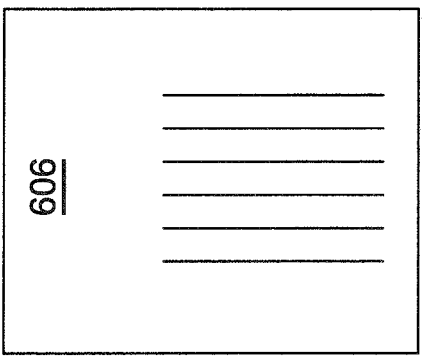
Figure 6:
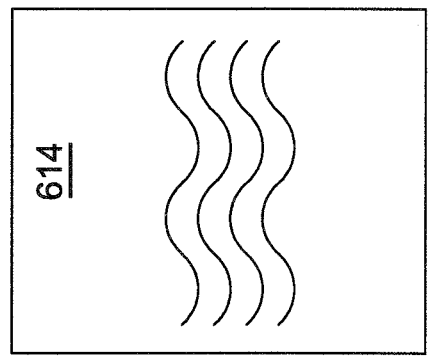
Figure 6:
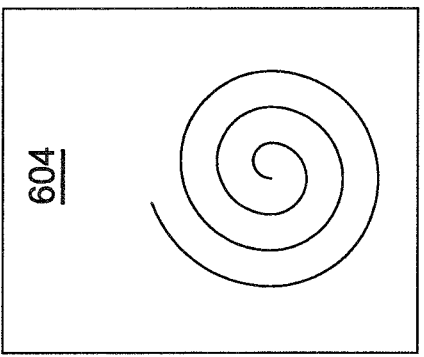
Figure 6:
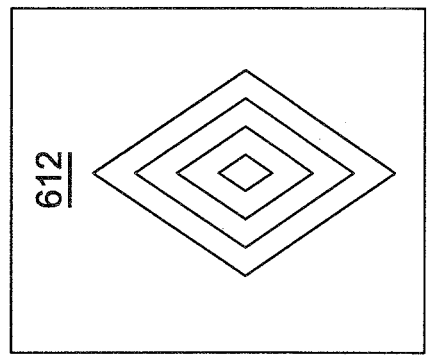
Figure 6:
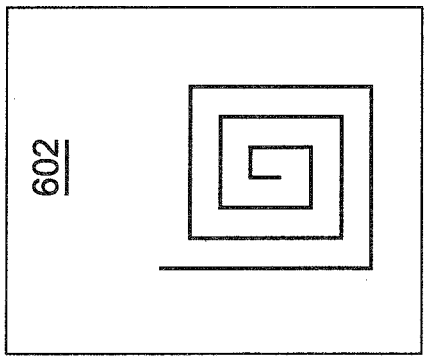
Figure 6:
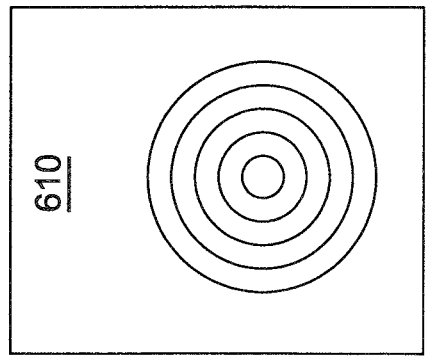

Turning now to FIG. 6, a number of patterns of thermo-reflective material deposited on compressed portions of a textile are shown in accordance with aspects herein. Compressed portions may be linear, as depicted in example textiles 100 and 500, or may have various shapes/patterns. It is conceived that in various portions of a textile, it may be desirable to have relatively higher or lower densities of compressed portions. Because compressed portions may have a greater total reflectance of IR heat waves than the uncompressed portions, higher concentrations of compressed portions will reflect greater amounts of IR heat energy. For example, a garment designed to retain heat in vicinity of the axilla may have a higher concentration of compressed portions in that area than in, for example, the flanks of a torso. This is because the axilla emits greater amounts of IR heat energy than the flanks of a torso; so, achieving greater IR reflectivity in this area by use of a higher number of compressed portions or a higher ratio of compressed portions to uncompressed portions helps to reflect the heat energy back to the wearer thereby helping the wearer to stay warm. To achieve various concentrations of compressed portions, various shapes/patterns of compressed portions are illustrated in accordance with aspects herein. As seen in FIG. 6, the one or more compressed portions may resemble: expanding square 602, expanding circle 604, parallel lines 606, non-parallel lines 608, concentric circles/ovals 610, concentric diamonds/squares/rectangles 612, waves (parallel or non-parallel) 614, and radiating lines 616. These are just a few examples of various patterns and it is contemplated herein that there may be additional patterns not shown. Moreover, patterns shown in FIG. 6 may be combined within a particular textile and/or garment. Any and all aspects, and any variation thereof, are contemplated as being within aspects herein.

Aspects herein contemplate incorporating any one or more of the textiles described herein, such as the textile 100, textile 300, textile 400, or textile 500 in a garment. A garment in accordance with aspects herein is configured to address the uneven heat loss exhibited by a human body, particularly during exercise. When exercising, the human body, unlike a theoretical blackbody, does not evenly radiate heat energy. Instead, humans radiate heat in different amounts in different portions of the body. Thus, when the textiles described herein are incorporated into a garment, it is contemplated that the garment may comprise one or more zones where compressed portions are present or more densely configured. These zones may be positioned in areas of the garment configured to be positioned adjacent to areas of the wearer's body exhibiting high heat loss (e.g., axilla, trapezius, spine, popliteal fossa, and calves). The garment may additionally comprise other zones where compressed portions are less densely configured or absent altogether. These zones may be positioned in areas of the garment configured to be positioned adjacent to portions of the wearer's body that exhibit relatively lower heat loss (e.g., portions of the abdominal cavity, knees, and gluteal region). Because the garment has breathability, permeability, and wicking characteristics due to the vapor deposition of the thermo-reflective material, evaporative heat loss may be regulated while retaining radiated heat.

Figure 7:
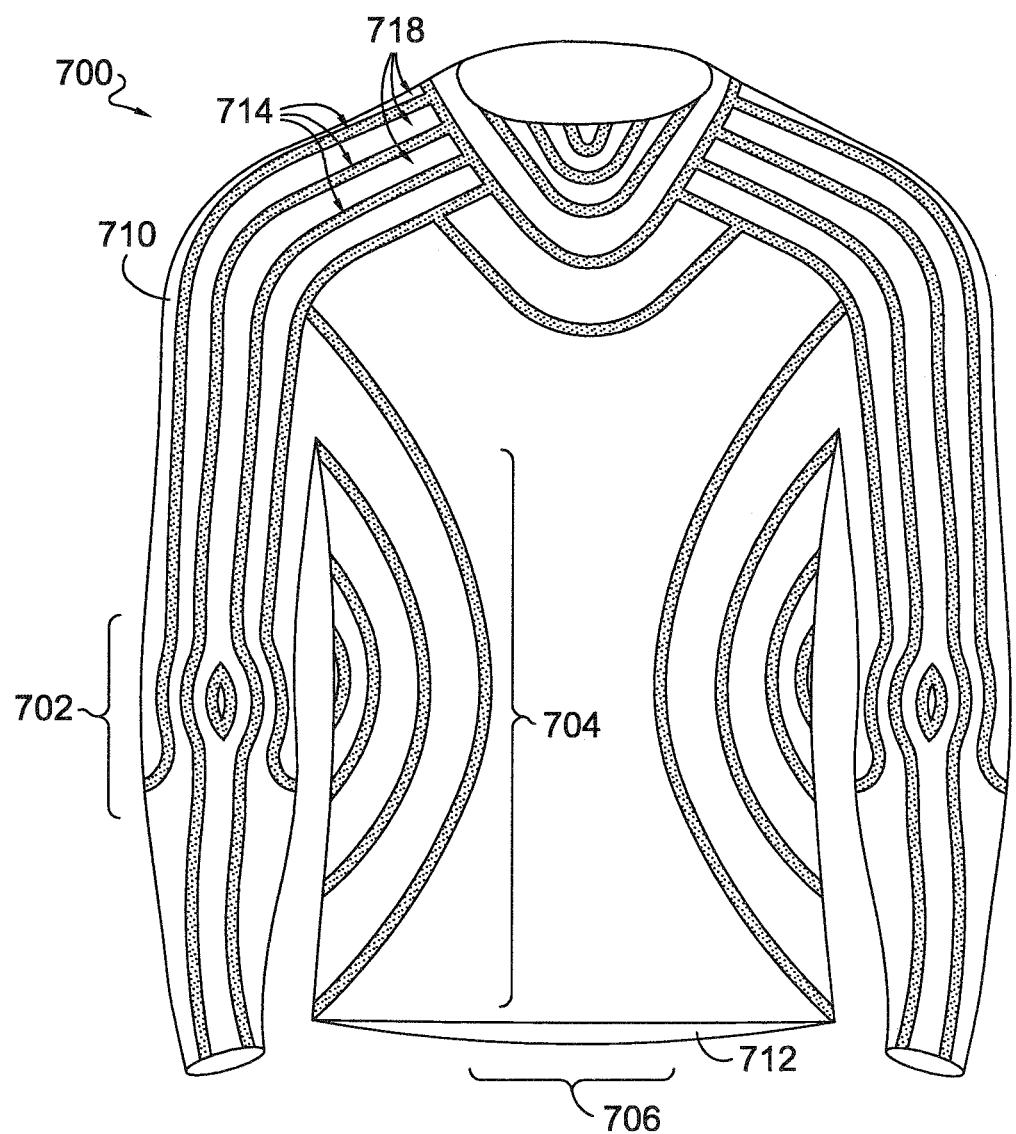
FIG. 7 illustrates an inside-out view of an example garment incorporating a textile having one or more deposits of thermo-reflective material in accordance with aspects herein.

An example garment 700 is shown in FIG. 7 in accordance with aspects herein. The garment 700 is shown in the form of an inside-out, upper-body garment (e.g., a shirt) to better illustrate the described features. Although shown as an upper-body garment, it is contemplated herein that the garment 700 may also be in the form of a lower-body garment, a whole body garment, headwear, footwear and the like. Moreover, although shown in the form of a shirt, it is contemplated herein that the garment 700 may take other forms such as a jacket, a pull-over, a hoodie, a vest, and the like. Any and all aspects, and any variation thereof, are contemplated as being within aspects herein. In example aspects, the garment 700 may be entirely formed from any one or more of the textiles described herein. Alternatively, one or more portions of the garment 700 may be formed from any one or more of the textiles described herein and other portions of the garment 700 may be formed from other textile types (e.g., woven, non-woven, different knit constructions, and the like). When describing the portions of the garment 700 that incorporate any one or more of the textiles described herein, reference numerals associated with the textile 100 will be utilized as examples.

With respect to the garment 700, in example aspects it is contemplated that the first surface 110 of the textile 100 may comprise an inner-facing surface 710 of the garment 700. Moreover, with respect to this aspect, the inner-facing surface 710 of the garment formed by the first surface 110 of the textile 100 may comprise one or more compressed portions 714 and one or more uncompressed portions 718, where the compressed portions 714 of the garment correspond to at least one or more of the compressed portions 114a-114d of the textile 100 and the uncompressed portions 718 of the garment 700 correspond to one or more of the uncompressed portions 118a-118e of the textile 100. In aspects, at least one of the compressed portions 714 is located at a first predetermined location on the garment 700 and at least one of the uncompressed portions 718 is located at a second predetermined location on the garment 700. In example aspects, the second surface 112 of the textile 100 may form an outer-facing surface 712 of the garment 700. However, it is contemplated herein that the garment 700 may comprise one or more additional layers secured to the second surface 112 of the textile 100 to form, for instance, a shell layer of the garment 700. Any and all aspects, and any variation thereof are contemplated as being within aspects herein.

In example aspects, the compressed portions 714 may comprise a deposit of thermo-reflective material, such as the thermo-reflective material 122 of the textile 100 (shown by the stippling in FIG. 7). In other aspects, the compressed portions 714 may comprise the deposit of thermo-reflective material 122 and the uncompressed portions 718 may comprise a second deposit of thermo-reflective material, the first and second deposits of thermo-reflective material being discontinuous (that is, some space separates the two deposits). In yet other aspects, the compressed portions 714 and the uncompressed portions 718 may comprise a single, continuous deposit of thermo-reflective material.

As introduced above, the garment 700 may comprise a plurality of zones. In a non-limiting example, the garment 700 may have a first zone 702, a second zone 704, and a third zone 706. The first zone 702 may correspond to an area of high relative heat loss on a wearer, such as the wearer's arms. The second zone 704 may correspond to an area of moderate heat loss, such as the sides of the wearer. The third zone 706 may correspond to an area of relatively low heat loss, such as the abdomen of the wearer. The number, location, size, and characteristics of the zones of a the garment 700 are examples only and it is contemplated that the garment 700 may comprise compressed portions 714 and uncompressed portions 718 in any configuration, number, shape, and size at any one or more predetermined locations on the garment 700.

Because the first zone 702 corresponds to an area of higher heat loss than, for example, the second zone 704 and the third zone 706, the ratio of the surface area of compressed portions 714 to the surface area of uncompressed portions 718 may be greater. Such an increased ratio may be due to increasing the width of the compressed portions 714 compared to the width of the uncompressed portions 718; alternatively or additionally, the width of the compressed portions 714 may remain constant and the width of the uncompressed portions 718 may be reduced, and/or the number of compressed portions to uncompressed portions may be increased with both having an equal width. By having a greater ratio of the surface area of the compressed portions 714 to the surface area of the uncompressed portions 718 in the first zone 702 than another zone, a greater amount of radiative heat loss from the body will be reflected inwardly towards the wearer.

It is contemplated that the second zone 704 has higher relative heat loss than the third zone 706 but less than the first zone 702. In areas of relatively moderate heat loss, such as the second zone 704, the ratio of the surface area of the compressed portions 714 to the surface area of the uncompressed portions 718 may be greater than in the third zone 706 but less than that of the first zone 702. It is contemplated that the third zone 706 has less radiative heat loss relative to the first zone 702 and the second zone 704. In aspects, the third zone 706 may have no compressed portions. In other aspects, the third zone 706 may have compressed portions; however, the ratio of the surface area of the compressed portions 714 to the surface area of the uncompressed portions 718 may be less than both the first zone 702 and the second zone 704.

Continuing, in any one or more zones, the widths of compressed portions 714 and uncompressed portions 718 may be constant (e.g., every compressed portion 714 has a width of about 5 mm and every uncompressed portion 718 has a width of about 8 mm). In aspects, in any one or more zones, the widths of compressed portions 714 and/or uncompressed portions 718 may vary (e.g., a first compressed portion has a width of about 5 mm, a second compressed portion has a width of about 8 mm, and/or a first uncompressed portion has a width of about 7 mm and a second uncompressed portion has a width of about 3 mm).

It is also contemplated that a garment, such as the garment 700, may be formed from the embossed textile 500. With respect to this aspect, an inner-facing surface of the garment may comprise the first surface 526 of the compressed portions 514 and the first surface 527 of the uncompressed portions 518, where at least the first surface 526 of the compressed portions 514 comprises a deposit of thermo-reflective material 522. Alternatively, the inner-facing surface of the garment may comprise the second surface 528 of the compressed portions 514 and the second surface 525 of the uncompressed portions 518, where at least the second surface 528 of the compressed portions 514 comprises a deposit of thermo-reflective material. Any and all aspects, and any variations thereof, are contemplated as being within aspects herein.

Figure 8:
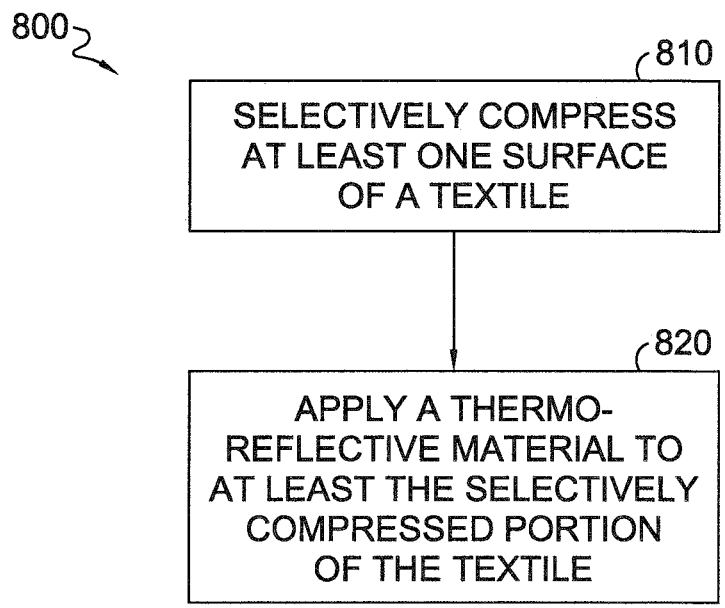
FIG. 8 illustrates a flow diagram of an example method of forming a textile in accordance with aspects herein where the textile is selectively compressed and the compressed portion(s) receives a deposit of a thermo-reflective material in accordance with aspects herein.

Turning now to FIG. 8, a flow diagram is depicted of an example method 800 of forming a textile comprising selectively compressed portions and deposit(s) of thermo-reflective material in accordance with aspects herein. At a step 810, a first surface of a textile, such as the textile 100, is selectively compressed to form at least one compressed portion and at least one uncompressed portion. In example aspects, the textile may be of knit construction, a woven construction, or a non-woven construction. In an aspect, the textile, especially when comprising a knit textile, may optionally be submitted to a calendaring process prior to selectively compressing the textile to form the compressed and uncompressed portion(s) to smooth or even out one or both of the first and second surfaces. In other aspects, any physical or chemical process may be used to smooth or even out at least the first surface of the textile.

A variety of physical processes may be used to selectively compress the textile to form at least one compressed portion. In aspects, a die system may be used to apply pressure to select portions of the first surface of a textile. The die may be configured to impress any pattern suitable, using pressure, to the first surface. By applying pressure in one portion of the textile, a compressed portion is formed; by not applying pressure to a second portion of the textile, an uncompressed portion (relative to the compressed portion) remains. In aspects, the first surface of the compressed portion is recessed, relative to the first surface of the uncompressed portion (i.e., debossed). In aspects, a continuous roll process may be used to selectively apply pressure to at least the first surface of a textile in order to form a compressed portion. In other aspects, the continuous roll process may utilize both pressure and heat to form the compressed portion of a textile. Using pressure only, the continuous roll process compresses the fibers of the compressed portion, creating a more uniform and flat surface, relative to the uncompressed portion. When using heat and pressure, the continuous roll process may additionally melt or soften the fibers of the textile to further increase the uniformity and flatness of the compressed portion, relative to the uncompressed portion. Whether using pressure or a combination of heat and pressure, the resulting compressed portion creates a substrate that will yield a greater luster for a thermo-reflective material deposited thereon.

Continuing, in step 820, a vaporized thermo-reflective material is applied to at least the selectively compressed portion of a textile. In aspects, the vaporized thermo-reflective material is applied via a vapor deposition process. In aspects, the vaporized thermo-reflective material comprises a metallized vapor. The metallized vapor may comprise aluminum, stainless steel, or other metals (and/or their alloys). In other aspects, any material (e.g., monomer, polymer) having thermo-reflective properties and capable of being applied by a vapor deposition processes may be used. In aspects, a solid thermo-reflective material is vaporized by adjusting heat and/or pressure to transition the substance from a solid state to a vapor state. In one example aspect, a solid aluminum wire is heated in a vacuum to transition the solid aluminum wire to an aluminum vapor which is then applied to the textile.

A vapor deposition process may be used to directly apply vaporized thermo-reflective material to the first surface of the textile, that is, the first substrate to which the vaporized thermo-reflective material will bind is the first surface of the textile. Alternatively or additionally, a vapor deposition process may be used to indirectly apply vaporized thermo-reflective material to the first surface of the textile via an intermediate substrate. In a non-limiting example, a vaporized thermo-reflective material may deposited using vapor deposition to a roller. The roller, comprising the thermo-reflective material, could then be passed over at least the first surface of the textile in order to convey the thermo-reflective material to at least a portion of the first surface of the textile.

Without regard to whether the vaporized thermo-reflective material is applied directly or indirectly via an intermediary substrate, in some aspects, uncompressed portions of the textile may be masked so as to create a deposit of the thermo-reflective material on only the surface of the compressed portion(s). In other aspects, the uncompressed portions may be masked during a first deposition, yielding a first deposit of thermo-reflective material in the compressed portion(s), and in a second and/or subsequent deposition, the compressed portion(s) may be masked, yielding a second deposit of thermo-reflective material in the uncompressed portion. In yet other aspects, neither portion is masked prior to the deposition, permitting the entire first surface (including both compressed portions and uncompressed portions) to yield a single and/or continuous deposit of vaporized thermo-reflective material.

Aspects of the present disclosure have been described with the intent to be illustrative rather than restrictive. Alternative aspects will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

What is claimed is:

1. A method of manufacturing a reflective textile comprising:
   selectively compressing portions of a first surface of a textile to form at least one uncompressed portion of the textile, at least one compressed portion of the textile, and a sidewall defining a boundary between the uncompressed portion and the compressed portion;
   applying a first deposit of thermo-reflective material to the first surface of the at least one compressed portion via a vapor deposition process; and
   applying a second deposit of thermo-reflective material to the at least one uncompressed portion via the vapor deposition process, wherein the thermo-reflective material is absent between the first deposit and the second deposit on the sidewall.

2. The method of manufacturing the reflective textile of claim 1, wherein the textile is selectively compressed by a debossing process in relation to the first surface.

3. The method of manufacturing the reflective textile of claim 2, wherein the at least one compressed portion is debossed using a continuous roll to roll process that uses a heated engraved roller to transfer a pattern to the first surface.

4. The method of manufacturing the reflective textile of claim 3, wherein the first deposit of thermo-reflective material is applied to the first surface of the at least one compressed portion by a roller, the roller having first received a deposit of the thermo-reflective material via the vapor deposition process.

5. The method of manufacturing the reflective textile of claim 1, wherein the thermo-reflective material is a metallized vapor.

6. A method comprising:
   compressing a portion of a surface of a textile to form an uncompressed portion of the textile, a compressed portion of the textile, and a sidewall defining a boundary between the uncompressed portion and the compressed portion;
   applying, to form a reflective textile, a deposit of thermo-reflective material to the compressed portion using a vapor deposition process; and
   applying a second deposit of thermo-reflective material to the uncompressed portion via the vapor deposition process, wherein the thermo-reflective material is absent from the sidewall other than an amount of the first deposit on the first surface of the at least one compressed portion.

7. The method of claim 6, wherein the thermo-reflective material is continuously applied to the compressed portion of the textile and to the uncompressed portion of the textile.

8. The method of claim 6, wherein compressing the portion of the surface includes debossing the portion.

9. The method of claim 8, wherein debossing comprises compressing the portion via a continuous roll to roll process that uses a heated engraved roller.

10. The method of claim 6, wherein the thermo-reflective material is a metallized vapor.

11. The method of claim 6 further comprising, constructing, with the reflective textile, a garment, wherein the surface of the textile comprises an inner-facing surface of the garment.

12. A method comprising:
   compressing portions of a surface of a textile to form an uncompressed portion, a compressed portion, and a sidewall defining a boundary between the uncompressed portion and the compressed portion;
   applying, via a vapor deposition process, a first deposit of thermo-reflective material to the compressed portion;
   applying a second deposit of thermo-reflective material to the uncompressed portion via the vapor deposition process, wherein the thermo-reflective material is absent from at least a portion of the sidewall; and
   constructing, with the textile, a garment, wherein the surface having the compressed portion with the deposit of thermo-reflective material comprises an inner-facing surface of the garment.

13. The method of claim 12, wherein the textile further comprises a second surface that opposes the surface and that forms an exposed outer surface of the garment.

14. The method of claim 12, wherein the garment includes an upper-body garment and constructing the garment includes arranging the compressed portion with the first deposit of thermo-reflective material in an arm sleeve of the upper-body garment.

15. The method of claim 12, wherein:
   the compressed portion and the uncompressed portion comprise a same material, and
   the compressed portion comprises a higher density of the same material.

16. The method of claim 1, wherein first deposit of thermo-reflective material comprises an exposed surface of the reflective textile.

17. The method of claim 1, wherein the first deposit of thermo-reflective material comprises an innermost-facing surface of the knit textile.

18. The method of claim 6, wherein the first deposit of thermo-reflective material comprises an exposed surface of the textile.

19. The method of claim 18, wherein the first deposit of thermo-reflective material comprises an innermost-facing surface of the knit textile.

20. The method of claim 12, wherein the first deposit of thermo-reflective material comprises an innermost-facing surface of the knit textile.

* * * * *